United States Patent
Xiao et al.

(10) Patent No.: US 10,921,480 B2
(45) Date of Patent: Feb. 16, 2021

(54) DOWNHOLE THREE-DIMENSIONAL SCANNING MAGNETIC RESONANCE IMAGING LOGGING INSTRUMENT, AND A PROBE, AN ANTENNA THEREOF

(71) Applicant: CHINA UNIVERSITY OF PETROLEUM—BEIJING, Beijing (CN)

(72) Inventors: Lizhi Xiao, Beijing (CN); Guangzhi Liao, Beijing (CN); Zhe Sun, Beijing (CN); Xin Li, Beijing (CN); Sihui Luo, Beijing (CN)

(73) Assignee: CHINA UNIVERSITY OF PETROLEUM-BEIJING, Beijing (CN)

( * ) Notice: Subject to any disclaimer, the term of this patent is extended or adjusted under 35 U.S.C. 154(b) by 88 days.

(21) Appl. No.: 16/362,590

(22) Filed: Mar. 22, 2019

(65) Prior Publication Data
US 2019/0293831 A1    Sep. 26, 2019

(30) Foreign Application Priority Data
Mar. 23, 2018  (CN) .......................... 201810247199.6

(51) Int. Cl.
*G01V 3/32*   (2006.01)
*E21B 47/024*   (2006.01)
(Continued)

(52) U.S. Cl.
CPC .............. *G01V 3/32* (2013.01); *E21B 47/002* (2020.05); *E21B 47/024* (2013.01); *E21B 49/00* (2013.01)

(58) Field of Classification Search
None
See application file for complete search history.

(56) References Cited

U.S. PATENT DOCUMENTS 4,254,373 A     3/1981  Lippmaa et al.
6,326,784 B1 *  12/2001  Ganesan .............. G01N 24/081
                                                          324/303
(Continued)

FOREIGN PATENT DOCUMENTS

CN        1253294 A     5/2000
CN      105240000 A     1/2016
(Continued)

OTHER PUBLICATIONS

The Chinese First Examination Report of corresponding Chinese application No. 201810247199.6, dated Jan. 9, 2020.

*Primary Examiner* — Nasima Monsur
(74) *Attorney, Agent, or Firm* — J.C. Patents

(57) ABSTRACT

The application provides a downhole three-dimensional scanning nuclear magnetic resonance imaging logging instrument and a probe, an antenna thereof, wherein the antenna comprises: an radio frequency antenna, an orienting device and a rotating device; the radio frequency antenna is fixed on an outer surface of the orienting device, and the orienting device is arranged on a magnet, the rotating device is fixed on the magnet; the rotating device is movably connected to the orienting device; and the rotating device is configured to drive the orienting device to rotate relative to the magnet, such that the radio frequency antenna on the orienting device can be drived to rotate, and echo signals in different directions can be acquired by the radio frequency antenna. The purpose of multi-directional measurement can be achieved, and the overall properties of an undisturbed stratum can be reflected by the applicant.

7 Claims, 6 Drawing Sheets

(51) Int. Cl.
    *E21B 49/00*         (2006.01)
    *E21B 47/002*       (2012.01)

(56) References Cited

U.S. PATENT DOCUMENTS

| | | | |
|---|---|---|---|
| 7,525,315 B2 * | 4/2009 | Fredette | E21B 47/01 |
| | | | 324/339 |
| 2002/0008514 A1 * | 1/2002 | Luong | G01N 24/081 |
| | | | 324/303 |
| 2003/0052678 A1 | 3/2003 | Gerald, II et al. | |
| 2013/0093422 A1 * | 4/2013 | Morys | H01Q 7/00 |
| | | | 324/303 |

FOREIGN PATENT DOCUMENTS

| | | |
|---|---|---|
| CN | 105473813 A | 4/2016 |
| CN | 105673007 A | 6/2016 |

* cited by examiner

DOWNHOLE THREE-DIMENSIONAL SCANNING MAGNETIC RESONANCE IMAGING LOGGING INSTRUMENT, AND A PROBE, AN ANTENNA THEREOF

CROSS-REFERENCE TO RELATED APPLICATIONS

This application claims priority to Chinese Patent Application No. 201810247199.6, filed on Mar. 23, 2018, which is hereby incorporated by reference in its entirety.

FIELD OF THE TECHNOLOGY

The application relates to the technical field of petroleum exploration, in particular to a downhole three-dimensional scanning nuclear magnetic resonance imaging logging instrument and a probe, an antenna thereof.

BACKGROUND

Nuclear magnetic resonance measurement technology is a technology using the nuclear magnetic resonance principle to detect oil and gas. Information on the porosity, permeability and bound fluid saturation of a stratum can be obtained by exploring the stratum conditions around a well. A radio frequency antenna can be set on a detection instrument to obtain echo signals of the stratum, and then information such as porosity, permeability and bound fluid saturation of the stratum can be determined according to the echo signals.

In the prior art, a radio frequency antenna is fixed on a surface of a magnet, and then echo signals of the stratum is obtained through the radio frequency antenna; or a radio frequency antenna is disposed opposite to a magnet, and the radio frequency antenna and the magnet are relatively stationary, and then the echo signals of a stratum are obtained through the radio frequency antenna.

However, in the prior art, the radio frequency antenna can only collect stratum information of one direction, and thus cannot perform multi-directional detection, and the echo signals collected by the method of the prior art cannot reflect the overall properties of an undisturbed stratum.

SUMMARY

The application provides a downhole three-dimensional scanning nuclear magnetic resonance imaging logging instrument and a probe, an antenna thereof, used for solving the problem that the radio frequency antenna can only collect stratum information of one direction, and thus cannot perform multi-directional detection, and the echo signals collected by the method of the prior art cannot reflect the overall properties of the undisturbed stratum.

In one aspect, the present application provides an antenna of a downhole three-dimensional scanning nuclear magnetic resonance imaging logging instrument, comprising:

a radio frequency antenna, an orienting device and a rotating device;

the radio frequency antenna is fixed on an outer surface of the orienting device, the orienting device is disposed on a magnet, and the rotating device is fixed on the magnet;

the rotating device is movably connected to the orienting device;

the rotating device is configured to drive the orienting device to rotate relative to the magnet, such that the radio frequency antenna on the orienting device can be drived to rotate, and echo signals in different directions can be acquired by the radio frequency antenna.

Further, the orienting device is a hollow cylinder, and the orienting device is sleeved on the magnet.

Further, the radio frequency antenna comprises at least one pair of antenna array units, and the at least one pair of antenna array units are uniformly distributed on the outer surface of the orienting device.

Further, the rotating device comprises a housing, the housing is a hollow annular cylinder, and the rotating device is sleeved on the magnet, and an inner surface of the rotating device is fixedly connected to the magnet;

a first annular clamping slot is disposed on one end of the orienting device, and one end of the rotating device is locked into the first annular clamping slot.

Further, the rotating device further comprises a built-in motor, a guiding belt and ball bearings;

the built-in motor is disposed inside the rotating device;

one end of the rotating device is provided with a groove, the guiding belt is laid in the groove, and the ball bearings are fixed on the guiding belt;

the built-in motor is configured to control the rotation of the guiding belt, such that the ball bearings can be drived to rotate, and the orienting device is drived to rotate relative to the magnet.

Further, the first annular clamping slot is provided with a sensor or a gyroscope;

the sensor is configured to determine a directional angle to which the orienting device is rotated according to the number of the ball bearings;

the gyroscope is configured to acquire the directional angle to which the orienting device is rotated.

Further, the antenna of the downhole three-dimensional scanning nuclear magnetic resonance imaging logging instrument further comprises a fixing device, the fixing device is fixedly connected to the magnet;

the fixing device is movably connected to the other end of the orienting device.

Further, the fixing device is a hollow annular cylinder, and the fixing device is sleeved on the magnet;

the other end of the orienting device is provided with a second annular clamping slot, one end of the fixing device is locked into the second annular clamping slot, and the orienting device is rotatable relative to the fixing device.

In another aspect, the present application provides a probe of a downhole three-dimensional scanning nuclear magnetic resonance imaging logging instrument, comprising:

a magnet and the above antenna of a downhole three-dimensional scanning nuclear magnetic resonance imaging logging instrument.

In another aspect, the present application provides a downhole three-dimensional scanning nuclear magnetic resonance imaging logging instrument, comprising:

a circuit structure and the above probe of a downhole three-dimensional scanning nuclear magnetic resonance imaging logging instrument;

the circuit structure is electrically connected to the magnet in the probe of the downhole three-dimensional scanning nuclear magnetic resonance imaging logging instrument, and the circuit structure is electrically connected to the radio frequency antenna in the probe of the downhole three-dimensional scanning nuclear magnetic resonance imaging logging instrument;

the circuit structure is configure to acquire a directional angle to which the orienting device in the probe of the downhole three-dimensional scanning magnetic resonance imaging instrument is rotated, and echo signals acquired by the radio frequency antenna in the probe of the downhole three-dimensional scanning magnetic resonance imaging logging instrument, and correlate the directional angle with the echo signals according to a timing relationship.

The application provides a downhole three-dimensional scanning nuclear magnetic resonance imaging logging instrument and a probe, an antenna thereof, the antenna of the downhole three-dimensional scanning magnetic resonance imaging instrument, comprising: a radio frequency antenna, an orienting device and a rotating device. The radio frequency antenna is fixed on an outer surface of the orienting device. The orienting device is disposed on a magnet and the rotating device is fixed on the magnet; the rotating device is movably connected to the orienting device. The rotating device is configured to drive the orienting device to rotate relative to the magnet, such that the radio frequency antenna on the orienting device can be drived to rotate, and echo signals in different directions can be acquired by the radio frequency antenna. Therefore, a nuclear magnetic resonance logging instrument can be obtained by applying the antenna of the downhole three-dimensional scanning nuclear magnetic resonance imaging logging instrument provided by the embodiment to a magnet, and when a rapid directional measurement is needed, the measurement can be performed by driving the radio frequency antenna on the orienting device via the rotating device, and when the radio frequency antenna of the embodiment is rotated to a specific position, the radio frequency antenna can transmit a specific radio frequency pulse and receive an echo signal, such that a targeted measurement in a specified direction can be completed, thereby greatly saving the energy required for a downhole measurement. For the circumferential multi-directional measurement, the information of a circumferential multi-directional stratum can be identified based on the rotation speed of the rotating device, the position recorded by the orienting device, and the echo signal received by the radio frequency antenna. Therefore, the purpose of multi-directional measurement can be achieved, and the overall properties of the undisturbed stratum can be reflected by the echo signal collected by the radio frequency antenna of the embodiment.

BRIEF DESCRIPTION OF THE DRAWINGS

The drawings herein are incorporated in and constitute a part of the specification, and illustrate the embodiments of the present application, and are used for explaining the principle of the present application.

REFERENCE SIGNS

Figure 1:
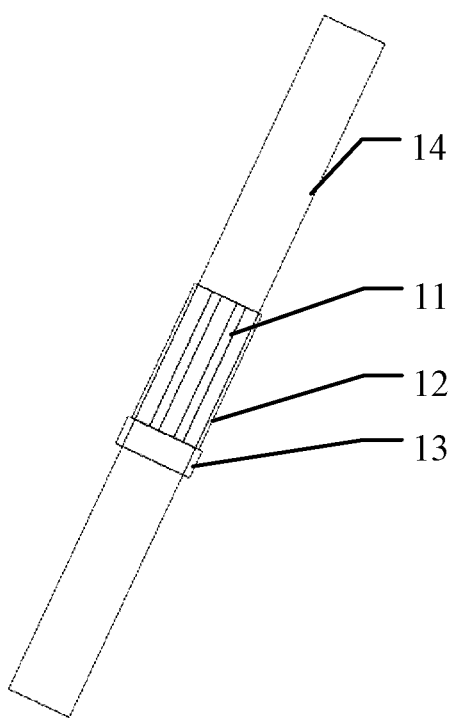
FIG. 1 is a schematic diagram of an antenna of a downhole three-dimensional scanning nuclear magnetic resonance imaging logging instrument according to an embodiment of the present application.

11: a radio frequency antenna; 12: an orienting device; 13: a rotating device; 14: a magnet; 21: antenna array units; 22: the first annular clamping slot; 23: a guiding belt; 24: ball bearings; 25: a fixing device; 26: the second annular clamping slot

DETAILED DESCRIPTION

Exemplary embodiments will be described in detail herein, which are illustrated in the accompanying drawings. When the following description refers to the drawings, the same number in different drawings represents the same or similar element, unless otherwise indicated. The embodiments described in the following examples do not represent all the embodiments that consistent with the present application. Instead, they are merely examples of devices and methods consistent with some aspects of the present application as detailed in the appended claims.

The specific application scenarios of the present application are as follows.

Now, the nuclear magnetic resonance technology has been applied to many fields such as physics, chemistry, material science, life science and medicine. In the 1950s, nuclear magnetic resonance technology began to be used in oil and gas industry, initially used in the field of reservoir rock physics; then with the development of nuclear magnetic resonance technology, nuclear magnetic resonance technology began to be applied to oil well measurement. Nuclear magnetic resonance logging technology is the technology using nuclear magnetic resonance theory to detect oil and natural gas. Information such as porosity, permeability, and bound fluid saturation of a stratum can be obtained by exploring the stratum conditions of a well. Technical means of nuclear magnetic resonance logging technology is mainly forming a static magnetic field by a magnet in a probe of the nuclear magnetic resonance logging instrument, and transmitting a radio frequency magnetic field pulse to a stratum by a radio frequency antenna, and collecting a resonance signal, thereby echo signals are collected by the radio frequency antenna, and then according to the collected echo signals, fluid stored in pores of a stratum rock can be analyzed by directly measuring the density of hydrogen nuclei in the reservoir fluid and the relaxation characteristics of fluid molecules.

It can be seen that a magnet and a radio frequency antenna are the most important components of a probe of a nuclear magnetic resonance logging instrument; the magnet is used to generate a static magnetic field in a stratum around the probe, so as to polarize hydrogen atoms in a fluid in the stratum; the radio frequency antenna is used to transmit a radio frequency magnetic field pulse to the stratum, so as to excite hydrogen atoms in the stratum which have been polarized by the static magnetic field, and generate nuclear magnetic resonance phenomena, and the radio frequency antenna is also used to receive and collect the nuclear magnetic resonance signals, that is, the radio frequency antenna is also used for receiving and collecting echo signals.

In the prior art, a centering-type probe is provided, which mainly comprises a magnet and a radio frequency antenna; wherein the magnet is cylindrical and the magnetization direction is perpendicular to the circumferential direction, and the magnet of this structure can radiate a magnetic field to all-dimensions around the outside of a well, and thereby a static magnetic field B0 meeting nuclear magnetic resonance detection requirements can be obtained at a certain depth of a stratum. The direction of the static magnetic field is perpendicular to that of a radio frequency pulse magnetic field B1 transmitted by the radio frequency antenna, that is, B0 and B1 are orthogonally matched, and the cross-sectional shape of a detected sensitive area is a circular shape. In the centering-type probe, radio frequency antennas are on the outer surface of the magnet respectively, and the radio frequency antennas can be fixedly connected to the magnet.

The prior art also provides an eccentric type probe. The eccentric type probe mainly comprises a main magnet, a shielding magnet, a magnetic core and a radio frequency antenna. Wherein the main magnet and the shielding magnet are in a rectangular shape, and the thickness of the main magnet is greater than that of the shielding magnet. The magnetization direction of the main magnet is perpendicular to the axial direction of the main magnet, and the magnetization direction of the shield magnet is perpendicular to the axial direction of the shielding magnet; the shielding magnet can concentrate magnetic force lines of a magnetic field in a distant area, so that a static magnetic field can be orthogonally matched with a radio frequency magnetic field in a large angle range. In an eccentric type probe, a radio frequency antenna is wound on a magnetic core, and the magnetic core is used to enhance the efficiency of the radio frequency antenna.

However, in a centering-type probe provided in the prior art, the detection range of the centering-type probe is 360 degrees of circumferential direction, and the information obtained by the detection are average values of a circumferential stratum. A centering-type probe does not have the function of single directional angle detection or multi-directional angle detection, and does not have the capacity of circumferential resolution. Therefore, in a centering-type probe, the difference of stratum information within a specific directional angle range cannot be detected by a radio frequency antenna of a centering-type probe, which is not conducive to identify stratum information having heterogeneity or high anisotropy properties.

In an eccentric type probe provided in the prior art, the eccentric type probe can be attached to a well wall to polarize a fluid in a stratum of a specific directional angle, but the detection range of the eccentric type probe is a specific directional angle, and a radio frequency antenna of the eccentric type probe cannot perform multi-directional angle detection. Information obtained by the radio frequency antenna of the eccentric type probe mainly comes from a stratum within a certain directional angle range, and cannot reflect the whole properties of an undisturbed stratum.

In summary, information of the stratum can only be collected by the radio frequency antenna of the nuclear magnetic resonance logging instrument of the prior art in one direction, and thus multi-directional angle detection cannot be performed, and whole properties of an undisturbed stratum cannot be reflected by the echo signals collected by the instrument of the prior art.

A downhole three-dimensional scanning nuclear magnetic resonance imaging logging instrument and a probe, an antenna thereof provided by the present application are intended to solve the above technical problems of the prior art.

The technical solutions of the present application and how the technical solutions of the present application solve the above technical problems will be described in detail below with reference to specific embodiments. The following specific embodiments may be combined with each other, and the same or similar concepts or processes may not be described in some embodiments. Embodiments of the present application will be described below with reference to the accompanying drawings.

FIG. 1 is a schematic diagram of an antenna of a downhole three-dimensional scanning nuclear magnetic resonance imaging logging instrument according to an embodiment of the present application. As shown in FIG. 1, the antenna of the downhole three-dimensional scanning magnetic resonance imaging logging instrument comprises:

a radio frequency antenna 11, an orienting device 12 and a rotating device 13;

the radio frequency antenna 11 is fixed on an outer surface of the orienting device 12, the orienting device 12 is disposed on a magnet 14, and the rotating device 13 is fixed on the magnet 14;

the rotating device 13 is movably connected to the orienting device 12;

the rotating device 13 is configured to drive the orienting device 12 to rotate relative to the magnet 14, such that the radio frequency antenna 11 on the orienting device can be driven to rotate, and echo signals in different directions can be acquired by the radio frequency antenna.

In this embodiment, specifically, the antenna of the downhole three-dimensional scanning nuclear magnetic resonance imaging logging instrument provided by the embodiment is composed of the radio frequency antenna 11, the orienting device 12 and the rotating device 13.

The radio frequency antenna 11 can be fixed on the outer surface of the orienting device 12. And the orienting device 12 is disposed on the magnet 14, the magnet 14 is a magnet constituting the probe of a nuclear magnetic resonance logging instrument; wherein the orienting device 12 can be rotatable relative to the magnet 14.

At the same time, the rotating device 13 is fixed on the magnet 14, and the rotating device 13 is movably connected to the orienting device 12.

Based on the above connection manner, the rotating device 13 can drive the orienting device 12 to rotate relative to the magnet 14; then the orienting device 12 can drive the radio frequency antenna 11 on the orienting device 12 to rotate; thereby the radio frequency antenna 11 can acquire echo signals in different directions during the logging operation. Thus, applying the antenna of the downhole three-dimensional scanning nuclear magnetic resonance imaging logging instrument provided by the embodiment to the magnet 14, a nuclear magnetic resonance logging instrument can be obtained, when a rapid orientation measurement is needed, the radio frequency antenna 11 on the orienting device 12 is driven by the rotating device 13 to perform the measurement, and when the radio frequency antenna 11 of the embodiment is rotated to a specific position, the radio frequency antenna 11 can transmit a specific radio frequency pulse and receive an echo signal, such that a targeted measurement in a specified direction can be completed, thereby greatly saving the energy required for a downhole measurement. For the circumferential multi-directional measurement, information of a circumferential multi-directional stratum can be identified based on the rotational speed of the rotating device 13, the position recorded by the orienting device 12, and the echo signal received by the radio frequency antenna 11.

The present embodiment provides an antenna of a downhole three-dimensional scanning nuclear magnetic resonance imaging logging instrument, the antenna is composed of a radio frequency antenna 11, an orienting device 12 and a rotating device 13. The radio frequency antenna 11 is fixed on an outer surface of the orienting device 12, and the orienting device 12 is disposed on a magnet 14, the rotating device 13 is fixed on the magnet 14; the rotating device 13 is movably connected to the orienting device 12; and the rotating device 13 is configured to drive the orienting device 12 to rotate relative to the magnet 14, so as to drive the radio frequency antenna 11 on the orienting device 12 to rotate, such that the radio frequency antenna 11 acquires echo signals in different directions. Therefore, applying the antenna of the downhole three-dimensional scanning nuclear magnetic resonance imaging logging instrument provided by the embodiment to the magnet 14, a nuclear magnetic resonance logging instrument can be obtained, when a rapid orientation measurement is needed, the radio frequency antenna 11 on the orienting device 12 is driven by the rotating device 13 to perform the measurement. When the radio frequency antenna 11 of the embodiment is rotated to a specific position, the radio frequency antenna 11 can transmit a specific radio frequency pulse and receive an echo signal, thereby the targeted measurement in a specified direction can be completed, thus, greatly saving the energy required for a downhole measurement. For the circumferential multi-directional measurement, information of a circumferential multi-directional stratum can be identified according to the rotational speed of the rotating device 13, the position recorded by the orienting device 12, and the echo signal received by the radio frequency antenna 11. Thereby, the purpose of multi-directional measurement can be achieved, and the overall properties of the undisturbed stratum can be reflected by the echo signals collected by the radio frequency antenna 11 of the embodiment.

Figure 2:
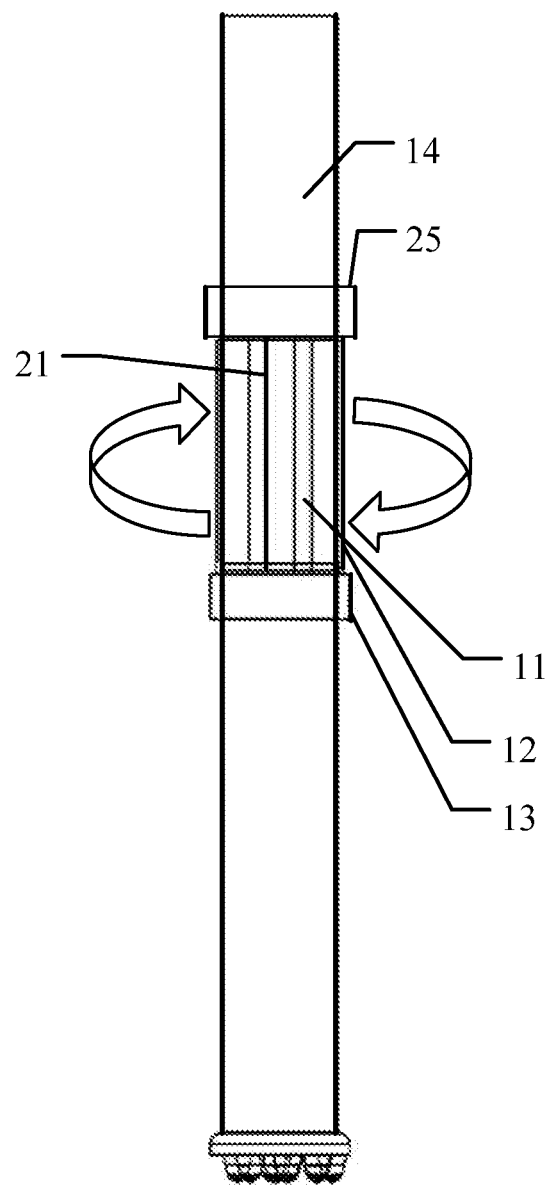
FIG. 2 is a schematic diagram of another antenna of a downhole three-dimensional scanning nuclear magnetic resonance imaging logging instrument according to an embodiment of the present application.
Figure 3:
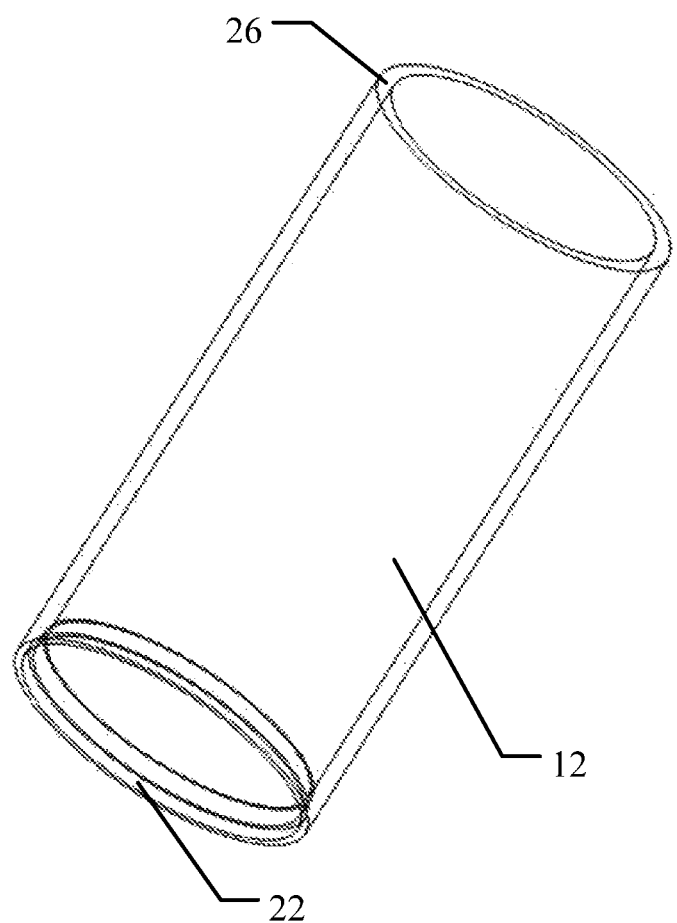
FIG. 3 is a schematic diagram of an orienting device in an another antenna of a downhole three-dimensional scanning nuclear magnetic resonance imaging logging instrument according to an embodiment of the present application.
Figure 4:
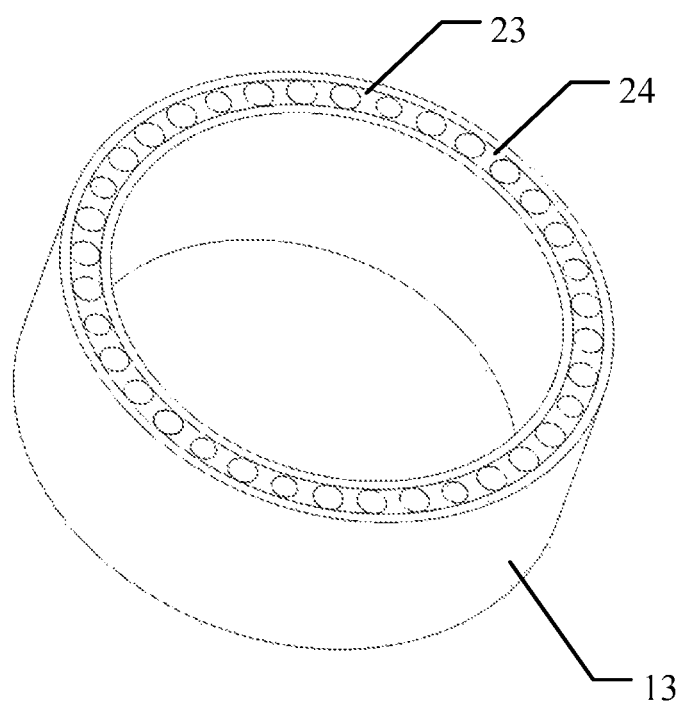
FIG. 4 is a schematic diagram of a rotating device in an another antenna of a downhole three-dimensional scanning nuclear magnetic resonance imaging logging instrument according to an embodiment of the present application.

FIG. 2 is a schematic diagram of another antenna of a downhole three-dimensional scanning nuclear magnetic resonance imaging logging instrument according to an embodiment of the present application, and FIG. 3 is a schematic diagram of an orienting device in an another antenna of a downhole three-dimensional scanning nuclear magnetic resonance imaging logging instrument according to an embodiment of the present application. FIG. 4 is a schematic diagram of a rotating device in an another antenna of a downhole three-dimensional scanning nuclear magnetic resonance imaging logging instrument according to an embodiment of the present application. On the basis of the embodiment shown in FIG. 1, as shown in FIG. 2 to FIG. 4, in the antenna of a downhole three-dimensional scanning nuclear magnetic resonance imaging logging instrument provided by the embodiment, the orienting device 12 is a hollow cylinder, and the orienting device 12 is sleeved on the magnet 14.

The radio frequency antenna 11 comprises at least one pair of antenna array units 21, and the at least one pair of antenna array units 21 are uniformly distributed on the outer surface of the orienting device 12.

The rotating device 13 comprises a housing, the housing is a hollow annular cylinder, the rotating device 13 is sleeved on the magnet 14, and an inner surface of the rotating device 13 is fixedly connected to the magnet 14; a first annular clamping slot 22 is disposed on one end of the orienting device 12, and one end of the rotating device 13 is locked into the first annular clamping slot 22.

The rotating device 13 further comprises a built-in motor, a guiding belt 23 and ball bearings 24; the built-in motor is disposed inside the rotating device 13; one end of the rotating device 13 is provided with a groove, the guiding belt 23 is laid in the groove, and the ball bearings 24 are fixed disposed on the guiding belt 23; the built-in motor is configured to control the rotation of the guiding belt 23, such that the ball bearings 24 can be driven to rotate, and the orienting device 12 is driven to rotate relative to the magnet 14.

The first annular clamping slot 22 is provided with a sensor or a gyroscope; the sensor is configured to determine a directional angle to which the orienting device 12 is rotated according to the number of the ball bearings 24; and the gyroscope is configured to acquire the directional angle to which the orienting device 12 is rotated.

The antenna of the downhole three-dimensional scanning nuclear magnetic resonance imaging logging instrument further comprises: a fixing device 25, the fixing device 25 is fixedly connected to the magnet 14; and the fixing device 25 is movably connected to the other end of the orienting device 12.

The fixing device 25 is a hollow annular cylinder, and the fixing device 25 is sleeved on the magnet 14; the other end of the orienting device 12 is provided with a second annular clamping slot 26, and one end of the fixing device 25 is locked into the second annular clamping slot 26, and the orienting device 12 is rotatable relative to the fixing device 25.

In the present embodiment, specifically, the magnet 14 is a cylindrical magnet 14. The orienting device 12 is a hollow cylinder, so the orienting device 12 can be sleeved on the cylindrical magnet 14. The radio frequency antenna 11 is composed of at least one pair of antenna array units 21, and the at least one pair of antenna array units 21 are uniformly distributed on the outer surface of the orienting device 12.

The rotating device 13 comprises a housing, the housing is a hollow annular cylinder, the rotating device 13 can be sleeved on the cylindrical magnet 14, and an inner surface of the rotating device 13 is fixedly connected to the magnet 14, that is, the rotating device 13 is fixedly connected to the magnet 14. The rotating device 13 is provided with a built-in motor, a guiding belt 23 and ball bearings 24. The built-in motor is disposed inside the housing of the rotating device 13; one end of the housing of the rotating device 13 is provided with a groove, and the guiding belt 23 is laid in the groove, and the ball bearings 24 are fixed on the guide belt 23. Further, a first annular clamping slot 22 is disposed on one end of the orienting device 12, and one end of the housing of the rotating device 13 is locked into the first annular clamping slot 22. The built-in motor can control the rotation of the guiding belt 23, such that the ball bearings 24 on the guiding belt 23 can be driven to rotate by the guiding belt 23. Since the ball bearings 24 are disposed at one end of the housing of the rotating device 13, and one end of the housing of the rotating device 13 is locked into the first annular clamping slot 22 of the orienting device 12, the ball bearings 24 are in contact with the orienting device 12, such that when the ball bearings 24 are rotated, the ball bearings 24 can drive the orienting device 12 to rotate, and thus the orienting device 12 can be driven to rotate relative to the magnet 14. Since the radio frequency antenna 11 is fixed on an outer surface of the orienting device 12, the radio frequency antenna 11 rotates with the rotation of the orienting device 12, and the radio frequency antenna 11 can transmit a radio frequency pulse and receive an echo signal during the rotation of the radio frequency antenna 11.

Further, a sensor may be provided in the first annular clamping slot 22 of the orienting device 12, such that with the rotation of the orienting device 12, the sensor can calculate a directional angle to which the orienting device 12 is rotated according to the number of the ball bearings 24. Wherein, it is prior art that using the sensor to calculate the direction angle to which the orienting device 12 is rotated according to the number of the ball bearings 24. Alternatively, a gyroscope may be provided in the first annular clamping slot 22 of the orienting device 12, such that with the rotation of the orienting device 12, the gyroscope can determine a directional angle to which the orienting device 12 is rotated, wherein the gyroscope itself has a function of determining the directional angle to which a device, in which the gyroscope is disposed, is rotated.

Further, the antenna of the downhole three-dimensional scanning nuclear magnetic resonance imaging logging instrument provided by the present embodiment further comprises a fixing device 25, the fixing device 25 is fixedly connected to the magnet 14, and the fixing device 25 is movably connected to the other end of the housing of the orienting device 12, thus the fixing device 25 ensures that the orienting device 12 would not be detached from the magnet 14. Specifically, the fixing device 25 is a hollow annular cylinder, the fixing device 25 can be sleeved on the cylindrical magnet 14; and a second annular card clamping slot 26 is disposed at the other end of the orienting device 12, and one end of the fixing device 25 is locked into the second annular clamping slot 26, and the orienting device 12 is rotatable relative to the fixing device 25, therefore, since one end of the fixing device 25 is locked to the second annular clamping slot 26 at the other end of the orienting device 12, and the orienting device 12 is rotatable relative to the fixing device 25, and one end of the rotating device 13 is locked into the first annular clamping slot 22 at one end of the orienting device 12, the orienting device 12 can rotate relative to the rotating device 13, the fixing device 25 and the magnet 14 during the rotation of the orienting device 12 driven by the rotating device 13. And since the fixing device 25 is connected to the other end of the orienting device 12, and the fixing device 25 is fixedly connected to the magnet 14, the orienting device 12 is locked between the fixing device 25 and the rotating device 13, the orienting device 12 would not be detached from the magnet 14.

The present embodiment provides an antenna of a downhole three-dimensional scanning nuclear magnetic resonance imaging logging instrument, the antenna is composed of a radio frequency antenna 11, an orienting device 12 and a rotating device 13. The radio frequency antenna 11 is fixed on an outer surface of the orienting device 12, and the orienting device 12 is disposed on a magnet 14, the rotating device 13 is fixed on the magnet 14; the rotating device 13 is movably connected to the orienting device 12; and the rotating device 13 is configured to drive the orienting device 12 to rotate relative to the magnet 14, such that the radio frequency antenna 11 on the orienting device 12 can be drived to rotate, and echo signals in different directions can be acquired by the radio frequency antenna 11. Therefore, since one end of the fixing device 25 is locked into the second annular clamping slot 26 at the other end of the orienting device 12, and the orienting device 12 is rotatable relative to the fixing device 25, and one end of the rotating device 13 is locked into the first annular clamping slot 22 at one end of the orienting device 12, the orienting device 12 can be rotated relative to the rotating device 13, the fixing device 25 and the magnet 14 during the rotation of the orienting device 12 driven by the rotating device 13. Since the fixing device 25 is connected to the other end of the orienting device 12, and the fixing device 25 is fixedly connected to the magnet 14, the orienting device 12 is locked between the fixing device 25 and the rotating device 13, and the orienting device 12 would not be detached from the magnet 14. Therefore, applying the antenna of the downhole three-dimensional scanning nuclear magnetic resonance imaging logging instrument provided by the embodiment to the magnet 14, a nuclear magnetic resonance logging instrument can be obtained, when a rapid orientation measurement is needed, the radio frequency antenna 11 on the orienting device 12 is driven by the rotating device 13 to perform the measurement, and when the radio frequency antenna 11 of the embodiment is rotated to a specific position, the radio frequency antenna 11 can transmit a specific radio frequency pulse and receive an echo signal, thereby the targeted measurement in a specified direction can be completed, thus, greatly saving the energy required for a downhole measurement. When performing a circumferential multi-directional measurement, information of a circumferential multi-directional stratum can be identified according to the rotational speed of the rotating device 13, the position recorded by the orienting device 12, and the echo signals received by the radio frequency antenna 11. Thereby, the purpose of multi-directional measurement can be achieved, and the overall properties of the undisturbed stratum can be reflected by the echo signals collected by the radio frequency antenna 11 of the embodiment.

Figure 5:
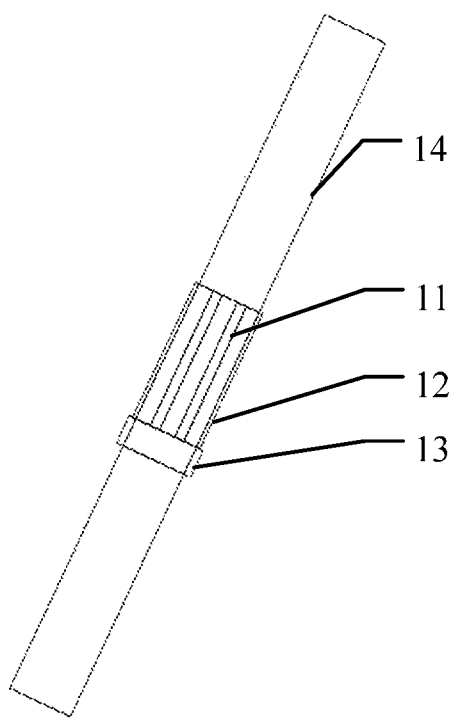
FIG. 5 is a schematic diagram of a probe of a downhole three-dimensional scanning nuclear magnetic resonance imaging logging instrument according to an embodiment of the present application.

FIG. 5 is a schematic diagram of a probe of a downhole three-dimensional scanning nuclear magnetic resonance imaging logging instrument according to an embodiment of the present application. As shown in FIG. 5, a probe of a downhole three-dimensional scanning magnetic resonance imaging logging instrument provided by the embodiment comprises: a magnet 14 and the antenna of the downhole three-dimensional scanning nuclear magnetic resonance imaging logging instrument provided by the above embodiments.

In this embodiment, specifically, the probe of the downhole three-dimensional scanning nuclear magnetic resonance imaging logging instrument is composed of the magnet 14 and the antenna of the downhole three-dimensional scanning nuclear magnetic resonance imaging logging instrument.

Wherein, the structure of the antenna of the downhole three-dimensional scanning magnetic resonance imaging logging instrument and its connection mode with the magnet 14 can be referred to the antennas of the downhole three-dimensional scanning magnetic resonance imaging logging instrument in the embodiments provided in FIG. 1 and FIG. 2, the structure and principle thereof are the same, and will not be described again.

Figure 6:
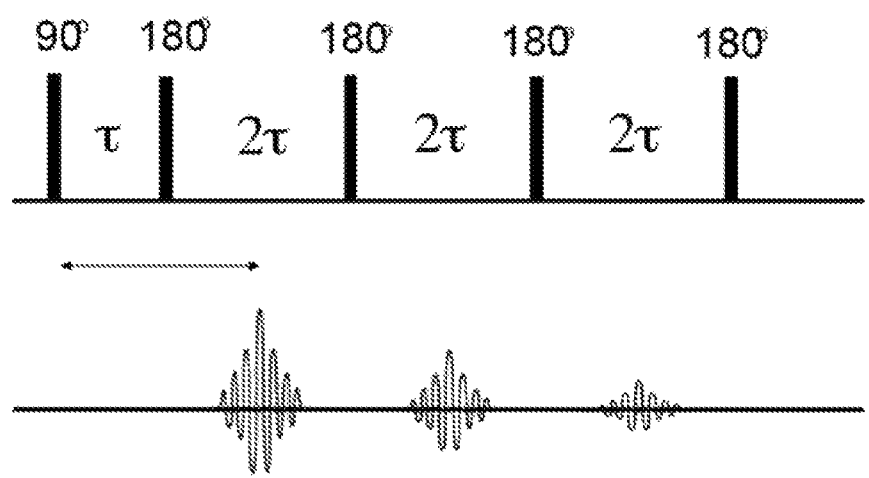
FIG. 6 is a sequence diagram of a radio frequency pulse sequence transmitted by a radio frequency antenna in a probe of a downhole three-dimensional scanning nuclear magnetic resonance imaging logging instrument according to an embodiment of the present application.

In this embodiment, as the magnet 14 generates a magnetic field, during the rotation of the radio frequency antenna 11, the radio frequency antenna 11 transmits a radio frequency pulse and receives an echo signal at each directional angle. FIG. 6 is a sequence diagram of a radio pulse sequence transmitted by a radio frequency antenna in a probe of a downhole three-dimensional scanning nuclear magnetic resonance imaging logging instrument according to an embodiment of the present application. As shown in FIG. 6, the pulse sequence transmitted by the radio frequency antenna 11 is only one or more, and the echo signals collected by the radio frequency antenna 11 are only first few echo signals. At this time, since the radio frequency antenna 11 takes seconds to rotate every turn, the radio frequency pulse and the echo signal are in the form of microsecond, so the radio frequency antenna 11 is not disturbed for collecting the echo signal while rotating, there is no need to stop the rotation of the radio frequency antenna 11 and then proceed with measurement, the obtained echo signal can reflect stratum information at a current direction, and the stratum information includes, for example, stratum porosity.

Figure 7:
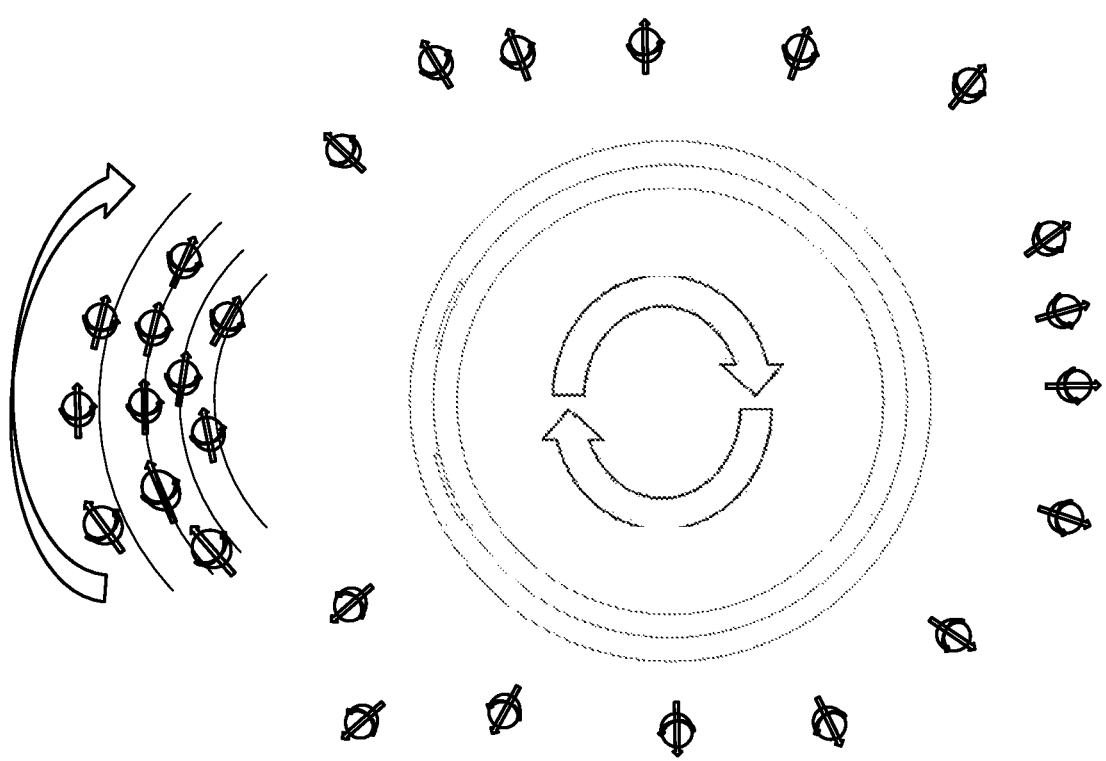
FIG. 7 is a mode diagram of circumferential or multi-directional measurements of a probe of a downhole three-dimensional scanning nuclear magnetic resonance imaging logging instrument according to an embodiment of the present application.

When using the probe of the downhole three-dimensional scanning nuclear magnetic resonance imaging logging instrument provided by the embodiment of the present application for circumferential or multi-directional measurement, FIG. 7 is a mode diagram of circumferential or multi-directional measurement of the probe of a downhole three-dimensional scanning nuclear magnetic resonance imaging logging instrument according to an embodiment of the present application. As shown in FIG. 7, because except hydrogen nuclei in an area scanned by a radio frequency pulse are removed and transferred, other areas are not subjected to removing and transferring, so scanning measurement can be directly performed. And the orienting device 12 can record a directional angle at each moment, so that after the probe performs circumferential or multi-directional scan, stratum information each directional stratum can be determined by the circumferential or multi-directional measurement at each moment, and the stratum information includes, for example, stratum porosity.

The present embodiment provides an antenna of a downhole three-dimensional scanning nuclear magnetic resonance imaging logging instrument, which is composed of the magnet 14 and the probe of the downhole three-dimensional scanning nuclear magnetic resonance imaging logging instrument provided by the above embodiment. The antenna of the downhole three-dimensional scanning nuclear magnetic resonance imaging logging instrument is composed of a radio frequency antenna 11, an orienting device 12 and a rotating device 13. The radio frequency antenna 11 is fixed on an outer surface of the orienting device 12. The orienting device 12 is disposed on a magnet 14, and the rotating device 13 is fixed on the magnet 14. The rotating device 13 is movably connected to the orienting device 12. The rotating device 13 is configured to drive the orienting device 12 to rotate relative to the magnet 14, such that the radio frequency antenna 11 on the orienting device 12 can be driven to rotate, and echo signals in different directions can be acquired by the radio frequency antenna 11. Therefore, applying the antenna of the downhole three-dimensional scanning nuclear magnetic resonance imaging logging instrument provided by the embodiment to the magnet 14, a nuclear magnetic resonance logging instrument can be obtained, when a rapid directional measurement is needed, the radio frequency antenna 11 on the orienting device 12 is driven by the rotating device 13 to perform the measurement, and when the radio frequency antenna 11 of the embodiment is rotated to a specific position, the radio frequency antenna 11 can transmit a specific radio frequency pulse and receive an echo signal, such that the targeted measurement in a specified direction can be completed, thereby greatly saving the energy required for a downhole measurement. For the circumferential multi-directional measurement, information of a circumferential multi-directional stratum can be identified based on the rotational speed of the rotating device 13, the position recorded by the orienting device 12, and the echo signal received by the radio frequency antenna 11. Thereby, the purpose of multi-directional measurement can be achieved, and the overall properties of the undisturbed stratum can be reflected by the echo signals collected by the radio frequency antenna 11 of the embodiment.

The embodiment of the present application further provides a downhole three-dimensional scanning nuclear magnetic resonance imaging logging instrument, comprising:

a circuit structure and the probe of a downhole three-dimensional scanning nuclear magnetic resonance imaging logging instrument provided by the above embodiments;

The circuit structure is electrically connected to a magnet in the probe of the downhole three-dimensional scanning nuclear magnetic resonance imaging logging instrument, and the circuit structure is electrically connected to the radio frequency antenna in the probe of the downhole three-dimensional scanning magnetic resonance imaging logging instrument;

the circuit structure is configure to acquire a directional angle to which the orienting device in the probe of the downhole three-dimensional scanning magnetic resonance imaging logging instrument is rotated, and echo signals acquired by the radio frequency antenna in the probe of the downhole three-dimensional scanning magnetic resonance imaging logging instrument, and correlate the directional angle with the echo signals according to a timing relationship.

In the embodiment, specifically, a downhole three-dimensional scanning nuclear magnetic resonance imaging logging instrument may also be called as a nuclear magnetic resonance logging instrument. The downhole three-dimensional scanning nuclear magnetic resonance imaging logging instrument of the present embodiment is composed of a circuit structure and the probe of a downhole three-dimensional scanning nuclear magnetic resonance imaging logging instrument provided by the above embodiments.

Wherein, for the structure and principle of a probe of the downhole three-dimensional scanning magnetic resonance imaging logging instrument, please refer to the probe of the downhole three-dimensional scanning magnetic resonance imaging logging instrument in the embodiment provided in FIG. 5, the structure and principle are the same, and will not be described again.

A circuit structure is electrically connected to the magnet in the above-mentioned probe of a downhole three-dimensional scanning magnetic resonance imaging logging instrument, and the circuit structure is electrically connected to the radio frequency antenna in the above-mentioned probe of a downhole three-dimensional scanning magnetic resonance imaging logging instrument.

A sensor or gyroscope in the probe of a downhole three-dimensional scanning magnetic resonance imaging logging instrument can transmit a directional angle to which the orienting device is rotated, and the corresponding time to a circuit structure, and then the circuit structure stores the directional angle and the corresponding time. A radio frequency antenna in the probe of the downhole three-dimensional scanning magnetic resonance imaging logging instrument transmits echo signals to the circuit structure in real time, and then the circuit structure stores the echo signals, and the circuit structure correlates the directional angle and echo signals according to a timing relationship. The directional angle and echo signals are transmitted to a computer from the circuit structure, the computer obtains the directional angle and echo signals having a time series relationship, and then the computer can calculate information of a stratum according to the echo signals.

The present embodiment provides a downhole three-dimensional scanning nuclear magnetic resonance imaging logging instrument based on a circuit structure and a probe of a downhole three-dimensional scanning nuclear magnetic resonance imaging logging instrument provided in the above embodiments. The probe of the downhole three-dimensional scanning nuclear magnetic resonance imaging logging instrument comprises a magnet and an antenna of a downhole three-dimensional scanning nuclear magnetic resonance imaging logging instrument provided in the above embodiments. The antenna of the downhole three-dimensional scanning nuclear magnetic resonance imaging logging instrument is composed of a radio frequency antenna, an orienting device and a rotating device. The radio frequency antenna is fixed on an outer surface of the orienting device, and the orienting device is disposed on a magnet, the rotating device is fixed on the magnet; the rotating device is movably connected to the orienting device; and the rotating device is configured to drive the orienting device to rotate relative to the magnet, such that the radio frequency antenna on the orienting device can be driven to rotate, and echo signals in different directions can be acquired by the radio frequency antenna. Therefore, applying the antenna of the downhole three-dimensional scanning nuclear magnetic resonance imaging logging instrument to the magnet, a nuclear magnetic resonance logging instrument can be obtained, when a rapid orientation measurement is needed, the radio frequency antenna on the orienting device is driven by the rotating device to perform the measurement, and when the radio frequency antenna of the embodiment is rotated to a specific position, the radio frequency antenna can transmit a specific radio frequency pulse and receive an echo signal, such that the targeted measurement in a specified direction can be completed, thus, greatly saving the energy required for a downhole measurement. For the circumferential multi-directional measurement, information of a circumferential multi-directional stratum can be identified according to the rotational speed of the rotating device, the position recorded by the orienting device, and the echo signal received by the radio frequency antenna. Thereby, the purpose of multi-directional measurement can be achieved, and the overall properties of the undisturbed stratum can be reflected by the echo signals collected by the radio frequency antenna 11 of the embodiment.

In consideration of the specification and practice of the application disclosed herein, those skilled in the art will readily appreciate other embodiments of the present disclosure. The present application is intended to cover any variations, uses, or adaptations of the present disclosure, which are in accordance with general principles of the present disclosure and include common general knowledge or conventional technical means in the art that are not disclosed in the present disclosure. The specification and examples are to be regarded as illustrative only, the true scope and spirit of the disclosure is pointed out by the following claims.

It is to be understood that the application is not limited to the above details and precise structures shown in the drawings, and can make various modifications and changes without departing from the scope thereof. The scope of the disclosure is limited only by the accompanying claims.

What is claimed is:

1. An antenna of a downhole three-dimensional scanning nuclear magnetic resonance imaging logging instrument, comprising:
   a radio frequency antenna, an orienting device and a rotating device; where
   the radio frequency antenna is fixed on an outer surface of the orienting device, the orienting device is disposed on a magnet, and the rotating device is fixed on the magnet;
   the rotating device is movably connected to the orienting device;
   the rotating device is configured to drive the orienting device to rotate relative to the magnet, such that the radio frequency antenna on the orienting device is driven to rotate, and echo signals in different directions are acquired by the radio frequency antenna;
   wherein the orienting device is a hollow cylinder, and the orienting device is sleeved on the magnet;
   the rotating device comprises a housing, the housing is a hollow annular cylinder, and the rotating device is sleeved on the magnet, and an inner surface of the rotating device is fixedly connected to the magnet;
   a first annular clamping slot is disposed on one end of the orienting device, and one end of the rotating device is locked into the first annular clamping slot;
   the rotating device further comprises a built-in motor, a guiding belt and ball bearings;
   the built-in motor is disposed inside the rotating device;
   one end of the rotating device is provided with a groove, the guiding belt is laid in the groove, and the ball bearings are fixed on the guiding belt;
   the built-in motor is configured to control a rotation of the guiding belt, such that the ball bearings are driven to rotate, and thereby the orienting device is driven to rotate relative to the magnet.

2. The antenna of the downhole three-dimensional scanning nuclear magnetic resonance imaging logging instrument according to claim 1, wherein the radio frequency antenna comprises at least one pair of antenna array units, and the at least one pair of antenna array units are uniformly distributed on the outer surface of the orienting device.

3. The antenna of the downhole three-dimensional scanning nuclear magnetic resonance imaging logging instrument according to claim 1, wherein the first annular clamping slot is provided with a sensor or a gyroscope;
   the sensor is configured to determine a directional angle to which the orienting device is rotated according to the number of the ball bearings;
   the gyroscope is configured to acquire the directional angle to which the orienting device is rotated.

4. The antenna of the downhole three-dimensional scanning nuclear magnetic resonance imaging logging instrument according to claim 1, wherein the antenna further comprises a fixing device, the fixing device is fixedly connected to the magnet;
   the fixing device is movably connected to the other end of the orienting device.

5. The antenna of the downhole three-dimensional scanning nuclear magnetic resonance imaging logging instrument according to claim 4, wherein the fixing device is a hollow annular cylinder, and the fixing device is sleeved on the magnet;
   the other end of the orienting device is provided with a second annular clamping slot, one end of the fixing device is locked into the second annular clamping slot, and the orienting device is rotatable relative to the fixing device.

6. A probe of a downhole three-dimensional scanning nuclear magnetic resonance imaging logging instrument, comprising:

a magnet and an antenna of the downhole three-dimensional scanning nuclear magnetic resonance imaging logging instrument, comprising:

a radio frequency antenna, an orienting device and a rotating device; where the radio frequency antenna is fixed on an outer surface of the orienting device, the orienting device is disposed on the magnet, and the rotating device is fixed on the magnet;

the rotating device is movably connected to the orienting device;

the rotating device is configured to drive the orienting device to rotate relative to the magnet, such that the radio frequency antenna on the orienting device is driven to rotate, and echo signals in different directions are acquired by the radio frequency antenna;

wherein the orienting device is a hollow cylinder, and the orienting device is sleeved on the magnet;

the rotating device comprises a housing, the housing is a hollow annular cylinder, and the rotating device is sleeved on the magnet, and an inner surface of the rotating device is fixedly connected to the magnet;

a first annular clamping slot is disposed on one end of the orienting device, and one end of the rotating device is locked into the first annular clamping slot;

the rotating device further comprises a built-in motor, a guiding belt and ball bearings;

the built-in motor is disposed inside the rotating device;

one end of the rotating device is provided with a groove, the guiding belt is laid in the groove, and the ball bearings are fixed on the guiding belt;

the built-in motor is configured to control a rotation of the guiding belt, such that the ball bearings are driven to rotate, and thereby the orienting device is driven to rotate relative to the magnet.

7. A downhole three-dimensional scanning nuclear magnetic resonance imaging logging instrument, comprising:

a circuit structure and a probe of a downhole three-dimensional scanning nuclear magnetic resonance imaging logging instrument, comprising:

a magnet and an antenna, wherein the antenna comprising:

a radio frequency antenna, an orienting device and a rotating device; where the radio frequency antenna is fixed on an outer surface of the orienting device, the orienting device is disposed on the magnet, and the rotating device is fixed on the magnet;

the rotating device is movably connected to the orienting device;

the rotating device is configured to drive the orienting device to rotate relative to the magnet, such that the radio frequency antenna on the orienting device is driven to rotate, and echo signals in different directions are acquired by the radio frequency antenna;

wherein the orienting device is a hollow cylinder, and the orienting device is sleeved on the magnet;

the rotating device comprises a housing, the housing is a hollow annular cylinder, and the rotating device is sleeved on the magnet, and an inner surface of the rotating device is fixedly connected to the magnet;

a first annular clamping slot is disposed on one end of the orienting device, and one end of the rotating device is locked into the first annular clamping slot;

the rotating device further comprises a built-in motor, a guiding belt and ball bearings;

the built-in motor is disposed inside the rotating device;

one end of the rotating device is provided with a groove, the guiding belt is laid in the groove, and the ball bearings are fixed on the guiding belt;

the built-in motor is configured to control a rotation of the guiding belt, such that the ball bearings are driven to rotate, and thereby the orienting device is driven to rotate relative to the magnet;

the circuit structure is electrically connected to the magnet in the probe of the downhole three-dimensional scanning nuclear magnetic resonance imaging logging instrument, and the circuit structure is electrically connected to the radio frequency antenna in the probe of the downhole three-dimensional scanning nuclear magnetic resonance imaging logging instrument;

the circuit structure is configure to acquire a directional angle to which the orienting device in the probe of the downhole three-dimensional scanning magnetic resonance imaging logging instrument is rotated, and echo signals acquired by the radio frequency antenna in the probe of the downhole three-dimensional scanning magnetic resonance imaging logging instrument, and correlate the directional angle with the echo signals according to a timing relationship.

* * * * *